United States Patent [19]
Blessing

[11] Patent Number: 5,187,632
[45] Date of Patent: Feb. 16, 1993

[54] CONTROLLABLE SEMICONDUCTOR SWITCHING DEVICE HAVING INTEGRATED CURRENT LIMITATION AND OVERHEATING DISCONNECTION

[75] Inventor: Alf Blessing, Heiningen, Fed. Rep. of Germany

[73] Assignee: Daimler-Benz AG, Stuttgart, Fed. Rep. of Germany

[21] Appl. No.: 909,529

[22] Filed: Jul. 8, 1992

[30] Foreign Application Priority Data

Jul. 9, 1991 [DE] Fed. Rep. of Germany ....... 4122653

[51] Int. Cl.$^5$ .............................................. H02H 5/04
[52] U.S. Cl. ..................................... 361/103; 361/93; 361/18; 307/117; 257/487
[58] Field of Search ..................... 361/58, 103, 18, 93; 357/28, 23.1; 307/310, 117

[56] References Cited

U.S. PATENT DOCUMENTS 4,896,199  1/1990  Tsuzuki et al. ..................... 357/28

FOREIGN PATENT DOCUMENTS 3821065  4/1990  Fed. Rep. of Germany .
3927307  4/1990  Fed. Rep. of Germany .

*Primary Examiner*—Todd E. DeBoer
*Attorney, Agent, or Firm*—Evenson, Wands, Edwards, Lenahan & McKeown

[57] ABSTRACT

A controllable semiconductor switching device having integrated overload protection of a load current path, including a switching section in the load current path and a multiplicity of main switching cells acting in parallel and having load-side terminals and non-load-side terminals including control terminals. The control terminals of the main switching cells are directly connected in a highly conducting manner among one another. A multiplicity of auxiliary switching cells are provided which carry a part of a total load current in parallel with the main switching cells in order to achieve an overload protection, and having load-side terminals and non-load-side terminals. The number of auxiliary switching cells are less than the number of main switching cells. The main switching cells and the auxiliary switching cells form the switching section. The load-side terminals of the main and auxiliary switching cells are directly connected in a highly conducting manner among and to one another, as are the non-load-side switching terminals. A second semiconductor switch has a switching section connected between the non-load-side switching terminals of the main switching cells. An element for measuring chip temperature is coupled to act on the second semiconductor switch with increasing chip temperature for turning the second semiconductor switch on. The element is disposed in the vicinity of the auxiliary switching cells at a periphery of a chip area covered by the main switching cells. At least one of the construction and a control variable of the auxiliary switching cells respectively differs from at least one of the construction and a control variable of the main switching cells in a manner such that specific current loading and specific power loss development of the auxiliary switching cells is essentially equally as great as that of the main switching cells with switching drive of the device and a load current below the overload limit. The specific current loading and the specific power loss development of the auxiliary switching cells increasingly exceeds monotonically that of the main switching cells with switching drive of the device and constant load current increase up to the overload limit.

11 Claims, 3 Drawing Sheets

PRIOR ART

CONTROLLABLE SEMICONDUCTOR SWITCHING DEVICE HAVING INTEGRATED CURRENT LIMITATION AND OVERHEATING DISCONNECTION

BACKGROUND AND SUMMARY OF THE INVENTION

The present invention relates to a controllable semiconductor switching device having a controllable integrated overload protection of the load current path. The switching section in the load current path is formed from a multiplicity of main switching cells acting in parallel, and a smaller number of auxiliary switching cells which carry a part of the total load current in parallel with the main switching cells in order to achieve an overload protection. At least the load-side terminals of the main and auxiliary switching cells are directly connected in a highly conducting manner among and to one another. The switching section of a further semiconductor switch is connected between the other, non-load-side switching terminals of the main switching cells. The control terminals of the main switching cells are directly connected in a highly conducting manner among one another.

In modern power transistors, overheating disconnection means are co-integrated on the chip. They respond before the power loss converted in the transistor assumes such a high value that the power transistor is consequently destroyed thermally. At the same time, an additional current limitation circuit is necessary to protect the power transistor against overheating in the event of a short circuit until the overheating disconnection system actually switches off, or has switched off, the power transistor.

An example in accordance with the prior art is illustrated in FIG. 4 in conjunction with FIGS. 3a and 3b. FIGS. 3a and 3b show characteristic curves which are typical for MOS field-effect power transistors, and FIG. 4 illustrates the working principle of the drive circuitry of such a transistor in accordance with the prior art. The power transistor $T_1$ is designed as an n-channel MOS field-effect transistor which comprises a parallel circuit of a multiplicity of individual switching cells, i.e. of individual MOS transistor cells. To switch the operating voltage $U_b$ through to the output A, the n-channel MOS power field-effect transistor $T_1$ requires a gate-source voltage $U_{GS}$ of typically 10V, this being provided by the charge pump CP. The output current of the charge pump CP is represented symbolically by the constant current source $CS_1$. A further MOS transistor $T_2$ is provided whose drain-source section is connected in parallel with the gate-source section of the transistor $T_1$. In the event of a short circuit, the gate-source voltage $U_{GS1}$ Of the transistor $T_1$ is reduced by the onstate of the transistor $T_2$ to such an extent that the current flow via the switching section of the transistor $T_1$ is suppressed. For this purpose, the gate of the transistor $T_2$ is driven, for example, by a temperature monitoring or measuring circuit TSC shown in broken lines which is in turn driven by a temperature sensor TS. The output of the measuring circuit TSC delivers a logic signal which, for example at 160° C., alters its level in a way which consequently turns on the transistor $T_2$ and remains in this state, for example as a result of a suitable hysteresis, until the temperature has fallen again by a predetermined amount. The power MOS transistor $T_1$ may be turned off completely for a certain cooling time.

It has, however, been found that the short-circuit strength of this known circuit arrangement shown in FIG. 4 is limited. The reason for this is that, for technological reasons, the temperature sensor TS can only be mounted at the periphery of the semiconductor structure forming the actual power transistor $T_1$. If a high power loss is produced in the individual MOS switching cells in the event of a short circuit because the maximum current occurs at a voltage drop corresponding to $U_b$, only the temperature of the MOS switching cells forming the actual power transistor $T_1$ increases markedly at first. The temperature of the chip environment, and consequently also the temperature of a temperature sensor TS disposed at a certain distance from it, follows only with a certain delay due to the finite propagation velocity of the temperature as a result of heat conduction. If the temperature gradient between the hottest region of the power transistor and the temperature sensor is too great, the semiconductor structure of the power transistor $T_1$ is irreversibly damaged owing to its temperature overshooting the maximum permissible value before the disconnection temperature of a monitoring circuit has been reached. In practice this has the result that the short-circuit strength can only be guaranteed to a limited extent or, alternatively, has to be paid for by limiting the maximum power of the power transistor $T_1$ by a current limitation threshold which has to be fixed at a sufficiently low level. This results in a sensitive switching power limitation.

German Patent Document DE 38 21 065 C2 describes a power MOSFET circuit in which the semiconductor switch comprises a multiplicity of individual switching cells which form a main switch and an auxiliary switch, the auxiliary switch preferably being formed in the center of the area covered by cells of the main switch. The auxiliary switch may be embodied as a single switching cell. The current accounted for by this auxiliary switching cell is sensed by a measuring resistor and a corresponding voltage drop is used to trigger a further semiconductor switch which short-circuits the control input of the main switch. In this case, a triggering characteristic is preferably achieved which turns off the main switch at the onset of the overload condition and keeps it turned off. This solution has the disadvantage that even pulse-type overloads of very short duration are enough to result in disconnection, although the chip substrate is still not bordering on its thermal capacity utilization under these circumstances. In addition, it is technologically difficult to dispose auxiliary switching cells interspersed in an insulated manner in the center of an array of main switching cells and to connect them with a periphery disposed outside the main switching cell array because this requires additional masking and deposition steps during the manufacture.

This device is therefore designed to achieve a maintainable safety state in which permanent damage to the switching device is avoided after an exceeding of the overload limit has already occurred.

German Patent Document DE 39 27 307 A1 describes a semiconductor device with a short-circuit protection circuit which basically corresponds in the manner of operation to the circuit described immediately above. Thus, the switching cells are also divided up into main elements and subordinate elements, preferably, for example, into main elements and only one subordinate element. The device is also designed in such a way that, depending on the voltage drop across an internal measuring resistor when the load is short-circuited, the load switching section is disconnected by short-circuiting the input of the load switch. In the absence of a load short circuit, a limiting exertion of influence on the current flow through the load switching section does not take place. The current limitation function is achieved without taking account of the thermal load-carrying capacity of the chip.

U.S. Pat. No. 4,896,199 describes a semiconductor device 15 having means for protecting it against overheating. In this case, temperature measuring and control means by which the switching cells disposed around them can also be turned off until the temperature has dropped below a certain chip temperature in the center of the switching cell array are provided in the center of the switching cell array. In relation to the manufacturing technology for such a device, what has already been stated in relation to German Patent Document DE 38 21 065 C2 applies analogously.

An object of the present invention is to provide a controllable semiconductor switching device which has integrated current limitation for preventing thermal destruction and optional overheating-dependent disconnection facility for the switching function, and which does not have the above-mentioned disadvantages, and can be produced simply with a minimum possible number of masks and has inherent short-circuit strength.

This and other objects are achieved by the present invention which provides a controllable semiconductor switching device having integrated overload protection of a load current path, including a switching section in the load current path and a multiplicity of main switching cells acting in parallel and having load-side terminals and non-load-side terminals including control terminals. The control terminals of the main switching cells are directly connected in a highly conducting manner among one another. A multiplicity of auxiliary switching cells are provided which carry a part of a total load current in parallel with the main switching cells in order to achieve an overload protection, and have load-side terminals and non-load-side terminals. The number of auxiliary switching cells are less than the number of main switching cells. The main switching cells and the auxiliary switching cells form the switching section. At least the load-side terminals of the main and auxiliary switching cells are directly connected in a highly conducting manner among and to one another. The non-load-side switching terminals of the main and auxiliary switching cells are also connected directly in a highly conducting manner among and to one another. A second semiconductor switch has a switching section connected between the non-load-side switching terminals of the main switching cells. An element for measuring chip temperature is coupled to act on the second semiconductor switch with increasing chip temperature for turning the second semiconductor switch on. The element is disposed in the vicinity of the auxiliary switching cells at a periphery of a chip area covered by the main switching cells. At least one of the construction and a control variable of the auxiliary switching cells respectively differs from at least one of the construction and a control variable of the main switching cells in a manner such that specific current loading and specific power loss development of the auxiliary switching cells is essentially equally as great as that of the main switching cells with switching drive of the device and a load current below the overload limit. The specific current loading and the specific power loss development of the auxiliary switching cells increasingly exceeds monotonically that of the main switching cells with switching drive of the device and constant load current increase up to the overload limit.

The semiconductor switching device of the present invention has the advantage of a reliable and accelerated response of an overheating protection function and makes a limitation of the current-carrying capacity of the actual switching section for the purpose of backing up a pure overheating limitation function in the current limitation case completely superfluous.

Consequently, the current limitation threshold can always be set very close to the maximum current actually possible per unit area of chip in any operating state and independently of the variation of the drive signal with time. Consequently, the switching power efficiency of the semiconductor chip can be maximized without this having to be paid for with a loss in reliability. At the same time, a temperature-measuring element does not have to be disposed in the center of a switching cell array. On the contrary, it can very advantageously be disposed at the periphery of such an array, with all the advantages resulting therefrom in relation to a defined and undisturbed temperature profile in the region of the critical point(s) of a switching cell array, however contoured, and in relation to the connection to other circuit parts close to the periphery of the chip.

Other objects, advantages and novel features of the present invention will become apparent from the following detailed description of the invention when considered in conjunction with the accompanying drawings.

DETAILED DESCRIPTION OF THE DRAWINGS

Figure 4:
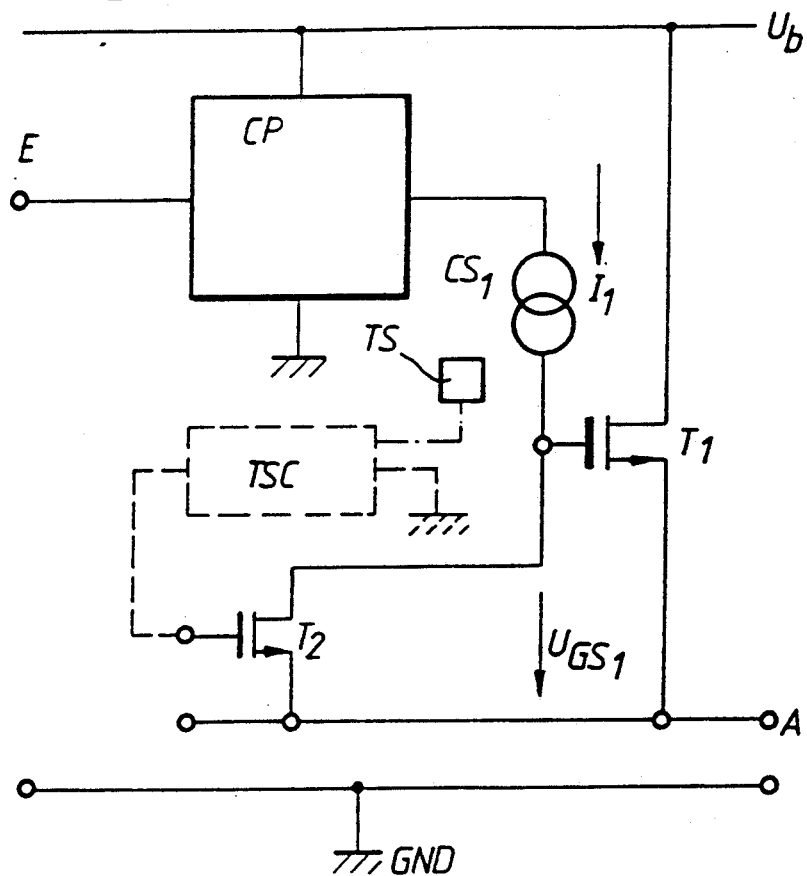
FIG. 4 shows the basic circuit diagram of a semiconductor switching device short-circuit protected in accordance with the prior art.
Figure 3A:
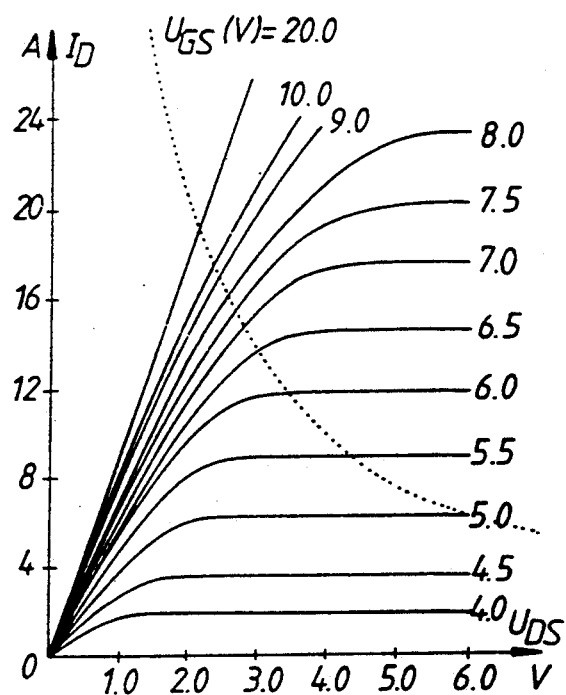
FIG. 3a shows output characteristic curves of a conventional semiconductor switch, by way of example in the form of an n-channel power MOS field-effect transistor where $I_D = f(U_{DS}, U_{GS})$.
Figure 3B:
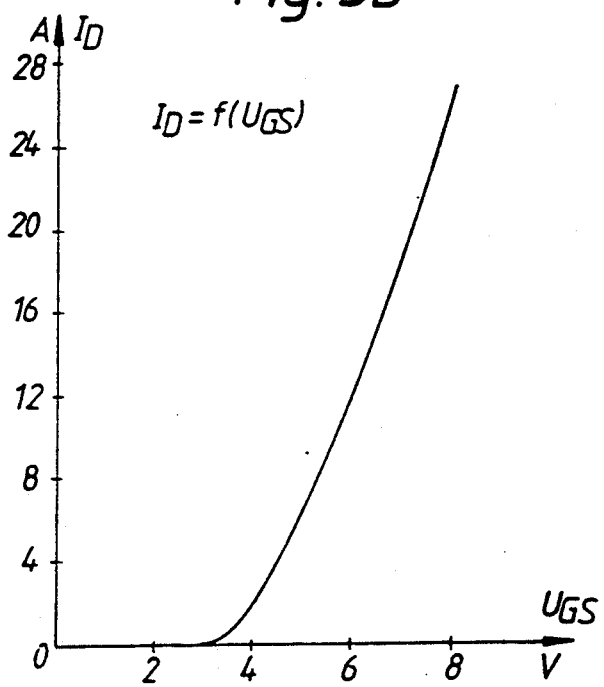
FIG. 3b shows the drive characteristic curve of a conventional semiconductor switch, by way of example in the form of an n-channel power MOS field-effect transistor where $I_D = f(U_{GS})$.

FIGS. 3a, 3b and 4 have already been described in the course of the explanation of the known solution in accordance with the prior art.

Figure 1:
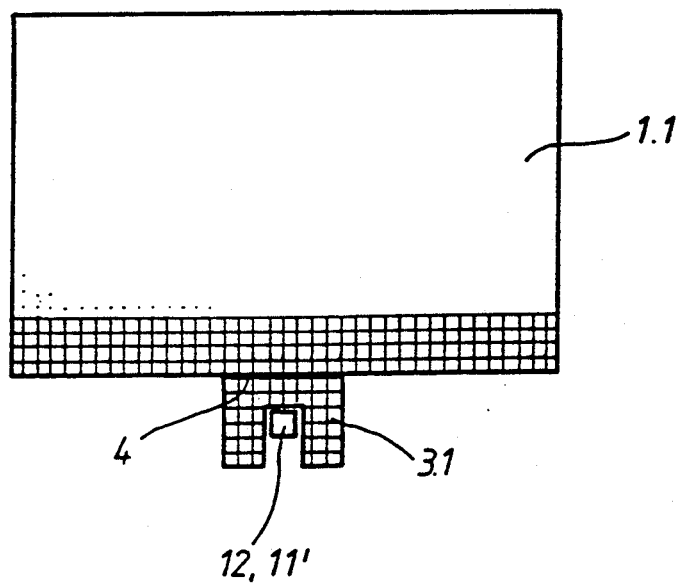
FIG. 1 is a plan view of a switching cell topology of a semiconductor switching device according to an embodiment of the present invention.
Figure 2:
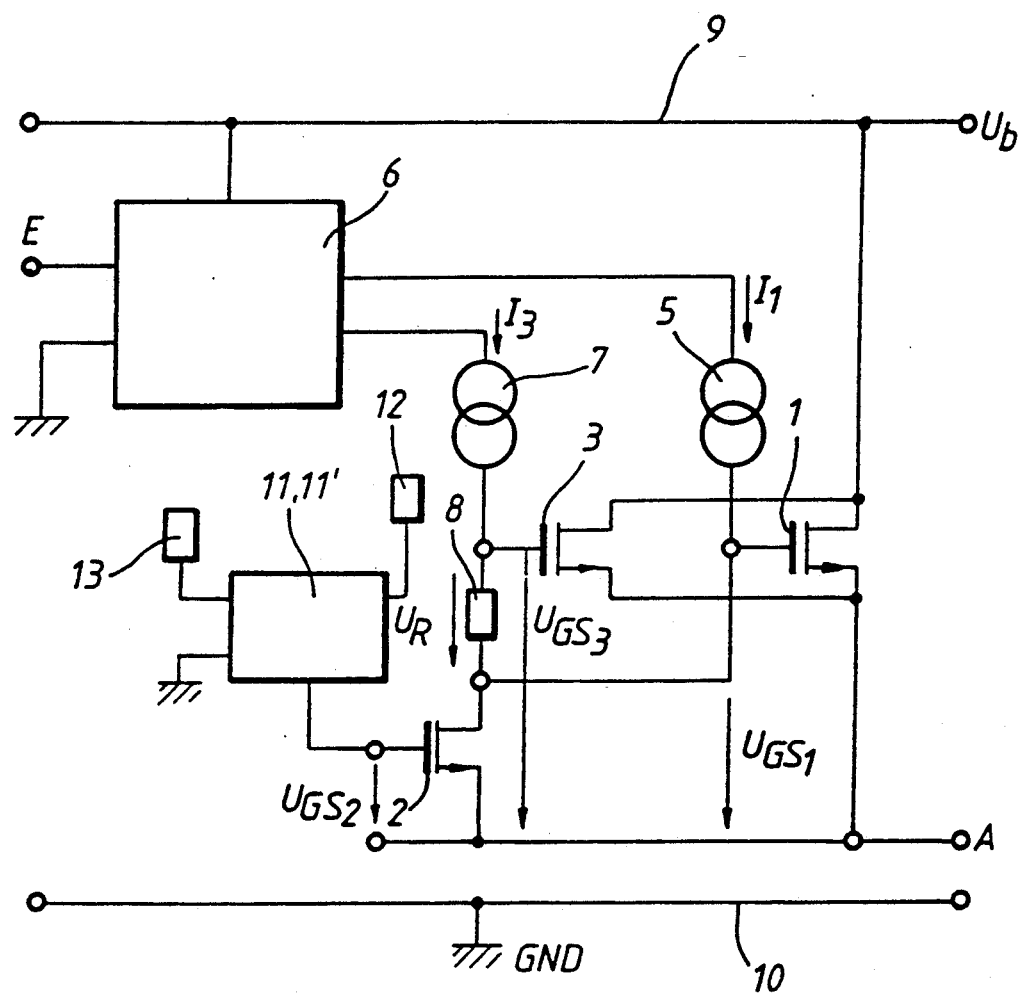
FIG. 2 shows an operational circuit diagram of a semiconductor switching device according to an embodiment of the present invention.

FIG. 1 illustrates a basic chip topology, which can be modified and adapted for specific design needs, of the switching cells of a semiconductor switching device according to the present invention. In FIG. 1, 1.1 denotes an array which comprises a multiplicity of individual main switching cells with parallel-connected, i.e. at the same potential, gate electrodes of the semiconductor switch 1 shown in FIG. 2. Reference numeral 3.1 denotes an array which comprises a smaller multiplicity of auxiliary switching cells having gate electrodes, also parallel-connected, of a smaller semiconductor switch 3 (FIG. 2). The semiconductor switches 1 and 3 have been produced using the same technology.

The two arrays 1.1, 3.1 adjoin one another, for example, along a boundary line 4. In practice, the array 1.1 can be shaped in such a way that it more or less encloses or comprises the array 3.1, but at any rate does not cover at least one signal path to a temperature sensor 12, which is disposed inside the array 3.1. Consequently, a circuit 11 for the combined load current measurement and evaluation and for the temperature monitoring can be disposed outside the arrays 1.1 and 3.1 and be connected to the temperature sensor 12 via signal paths. As a current limitation and temperature measuring circuit 11' which is separately integrated in terms of area, it can nevertheless also integrally concomitantly comprise a temperature sensor. In such a case, the circuit 11' can be disposed at a suitable point so as to be more or less enclosed by array 3.1 instead of being a discrete temperature sensor 12.

In the exemplary embodiment shown in FIG. 2, the switching section of the semiconductor switch 1 is connected to the operating voltage $U_b$ and also to the output A of the semiconductor switching device. A gate signal, for example a current $I_1$, is applied to its gate electrode in a manner known per se, for example by means of a current source 5 at the output of a drive circuit 6, for example a charge pump. The drive circuit 6 has, in turn, a drive input E.

Connected between the gate electrode of the semiconductor switch 1 and its reference electrode connected to output A in a manner previously known per se is the switching section of a further semiconductor switch 2. Consequently, the gate voltage $U_{GS1}$ of the semiconductor switch 1 is applied across the switching section of this semiconductor switch 2. A gate voltage $U_{GS2}$ is applied to the gate electrode of the semiconductor switch 2 by the combined load current measuring and temperature evaluating circuit 11 having separate temperature sensor 12 and load current sensor 13 or a corresponding circuit 11' with a temperature sensor integrated therein. The temperature evaluating characteristic of the circuit 11 or 11' may preferably have a hysteresis switching characteristic, already mentioned, with a temperature-triggered action and with the action of an unambiguous and complete disconnection facility for the semiconductor switch 1 prior to its thermal destruction. The current sensor 13 can be embodied in any desired manner, for example even as an integral component of at least one of the structures of the semiconductor switches 1 and 3.

Associated with the output side of the drive circuit 6 in this case is also a further current source 7 which is operationally connected to the gate electrode of a third semiconductor switch 3. The switching section of the semiconductor switch 3 is connected in parallel with that of the semiconductor switch 1. The gate electrodes of the semiconductor switches and 3 are operationally interconnected, the illustrated embodiment, for example, by means of a resistor 8. In practice, the resistor 8 may also be replaced by or combined with at least one p-n or n-p semiconductor junction in forward-threshold or Zener mode. At least one of the current sources 5 and 7 may also be replaced by a resistor, or the current source 5 can be omitted completely so that the gate electrodes of the transistors 1 and 3 are then biased exclusively by the current $I_3$, i.e. by only one common control signal.

The device of the present invention functions as follows. The current sources 5 and 7, or suitable series resistors, bring about a defined switching behavior by providing defined reloading currents for the gate electrodes of the semiconductor switches 1 and 3. Assuming an identical technology and an identical switching cell structure and given identical drive voltages ($U_{GS1} = U_{GS3}$) for the semiconductor switches and 3, identical subcurrents flow through the switching cells which make them up in the arrays 1.1 and 3.1.

As long as the total switching current flowing does not cause the current limitation function of the circuit 11 or 11' to operate, the semiconductor switch 2 is not driven or is driven only to a very slight extent, and $U_{GS2}$ is therefore, for example, identical to or close to zero. Since the switching section of the switch 2 does not therefore conduct and is consequently incapable of carrying any current, $U_R$ becomes zero. AS a consequence of this, the gate electrodes of the switches 1 and 3 are at a high potential via the current sources 5 and 7 (or via corresponding ohmic resistors 5 and 7), $U_{GS1}$ being equal to $U_{GS3}$. As a consequence, with current limitation not yet setting in, equal specific currents flow through identically constructed switching cells of the semiconductor switches 1 and 3 and a totally balanced temperature distribution consequently arises in the current-carrying region of the semiconductor chip.

If the load current exceeds a permissible criterion, the signal emitted by the load current sensor 13 to the circuit 11 or 11' results in the onset of the current limitation as a result of the rise in $U_{GS2}$. As a result, the switch 2 is more or less turned on, i.e. it acts as a current drain and consequently results in a voltage drop $U_R$ across the resistor 8 (or an alternatively provided p-n or n-p junction). Because of the current flow $I_3$, gate voltage $U_{GS1}$ is consequently reduced by the voltage drop $U_R$ with respect to the gate voltage $U_{GS3}$ of the semiconductor switch 3. From the typical characteristic curve shown in FIG. 3b, which also applies analogously for each individual switching cell of the corresponding semiconductor switches, this results in a higher specific current loading for the auxiliary switching cells associated with array 3.1. As a consequence of this, the specific power loss converted in the array 3.1 is larger than in the switching cells of the array 1.1, which results in a larger liberated thermal power and consequently faster heating to a higher temperature than in the cells of the semiconductor switch 1.

In connection with a suitable dimensioning of the drive circuit 6, this at any rate achieves the result that, in the current limitation case, the drive voltage $U_{GS3}$ for the cells of the semiconductor switch 3 which are in the immediate vicinity, namely grouped around the temperature sensor 12 or the temperature measuring circuit 11', is higher by a certain amount $U_R$ than for all the other cells of the semiconductor switch 1. This therefore artificially causes a defined imbalance in the temperature distribution in the region of the temperature measurement so as to deliberately enforce a particularly rapid heating of the element which measures the chip temperature.

On exceeding a predetermined limit temperature, the circuit 11 or 11' can be tripped from the pure current limitation mode or current limitation with hysteresis which is reversible with respect to temperature into a disconnection mode and consequently bring about the complete turning-off of the switches 1 and 3 over a certain cooling phase. For this purpose, for example, a control path, which is not shown in the figure, via which at least one of the control signals $I_1$ and $I_3$ in the drive circuit 6 can be set to zero for the disconnection time, can also additionally be provided between the circuit 11 or 11' and the drive circuit 6. Alternatively, the gate electrode of the semiconductor switch 3 can be connected to the output A or to ground potential 10 via the switching section of a further semiconductor switch, which is also not shown in the figure and which is to be driven by the circuit 11 or 11', for as long as the switch 2 is fully turned on.

For the short-circuit case A-GND, $U_{RK}$ is expediently chosen in such a way that the temperature at the position of the temperature sensor 12 or of the temperature measuring circuit 11 is equal to, or higher than, the temperature at any other point in the array 1.1, in particular in its center or critical point. This consequently ensures that, if the current limitation is operative, the auxiliary switching cells in the array 3.1 which are disposed in the immediate environment of the temperature sensor 12 or of the current limitation and temperature measuring circuit 11' are always heated most intensely and consequently an overload state is sensed or measured with the shortest possible delay. A disconnection of the semiconductor switching device as a result of overloading can thus be initiated substantially earlier than in accordance with the prior art without there being the danger of an uncontrolled selective overheating of the switching cells of the semiconductor switch 1 which carry the main current, and consequently of damage to the semiconductor switch 1.

The present invention is not limited to the exemplary embodiment described with separate driving of certain switching cells. For example, an embodiment of the present invention manages without an element 8 for obtaining two control variables which are different in terms of amount and without a separate drive path of a corresponding semiconductor switch 3'. This is accomplished if technological measures are taken to ensure that, for a certain number of particular switching cells in a corresponding array 3.1, a characteristic curve according to FIG. 3b is obtained which is steeper than the corresponding characteristic curve for all the other switching cells of a semiconductor switch 1' which carries the main current. In such a case, a separation line 4, which is visible to the observer, between arrays containing switching cells to be assigned to a semiconductor switch 1' and a semiconductor switch 3' can be completely absent and the connection of the drive electrodes of all the switching cells can consequently be continuous.

The measure according to the invention for improving the short-circuit strength of semiconductor switching devices is also not limited to the specific exemplary embodiment shown in FIG. 2 in a wider sense. The embodiment illustrated in FIG. 2 is generally based on n-channel MOS transistors as semiconductor switches and these have operating characteristics in accordance with the characteristic curves in FIGS. 3a and 3b.

Other semiconductor switching components having different characteristics are also possible without departing from the scope of the invention. In FIG. 2, the transistor $T_1$ switches an operating voltage $U_b$ to ground 10 (high-side switch). The reverse case of switching the ground potential to the operating voltage $U_b$ is also possible (low-side switch). Depending on the polarity and/or technology of the power switch $T_1$ and of the semiconductor $T_3$, a charge pump, for example, may be necessary or may be dispensed with as a drive circuit. With a construction of switching cells having different steepness for each array, a drive circuit 6 may also be reduced to an ohmic voltage divider or a conductor branching or may be completely dispensed with. The short-circuit strength can also be increased in the manner described by using bipolar technologies to form the power switch. In that case, however, the influencing variable which has to be set higher in the short-circuit case is not the base voltage but the base current of a corresponding bipolar transistor $T_3$ or corresponding transistor structures within an array 3.1 in the vicinity of the temperature sensor 12 or of a temperature measuring circuit 11' in order to produce the highest temperature at the position of the temperature-measuring element. All these modifications are included within the scope of the claimed invention.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. Controllable semiconductor switching device having integrated overload protection of a load current path, comprising:
   a switching section in the load current path;
   a multiplicity of main switching cells acting in parallel and having load-side terminals and non-load-side terminals including control terminals, the control terminals of the main switching cells being directly connected in a highly conducting manner among one another;
   a multiplicity of auxiliary switching cells provided which carry a part of a total load current in parallel with the main switching cells in order thereby to achieve an overload protection, and having load-side terminals and non-load-side terminals, the number of auxiliary switching cells being less than the number of main switching cells, the main switching cells and the auxiliary switching cells forming the switching section;
   wherein at least the load-side terminals of the main and auxiliary switching cells are directly connected in a highly conducting manner among and to one another, and the non-load-side switching terminals of the main and auxiliary switching cells are also connected directly in a highly conducting manner among and to one another;
   a first semiconductor switch having a switching section connected between the non-load-side switching terminals of the main switching cells;
   an element for measuring chip temperature, coupled to act on the first semiconductor switch with increasing chip temperature for turning the second semiconductor switch on, said element being disposed in the vicinity of said auxiliary switching cells at a periphery of a chip area covered by the main switching cells;
   wherein at least one of the construction and a control variable of the auxiliary switching cells respectively differs from at least one of the construction and a control variable of the main switching cells in a manner such that specific current loading and specific power loss development of the auxiliary switching cells is essentially equally as great as that of the main switching cells with switching drive of the device and a load current below a permissible criterion, and such that the specific current loading and the specific power loss development of the auxiliary switching cells increasingly exceeds monotonically that of the main switching cells with switching drive of the device and constant load current exceeding said permissible criterion.

2. The device according to claim 1, wherein the element is essentially enclosed by the auxiliary switching cells.

3. Device according to claim 1, wherein the main switching cells and the auxiliary switching cells are at least one of conventional bipolar transistor cells and conventional MOS transistor cells.

4. Device according to claim 1, wherein the main switching cells and the auxiliary switching cells have gate electrodes that are connected in a highly conducting manner among and to one another such that all the switching cells are driveable with the same control variable, the auxiliary switching cells having a higher slope of the function of their output conductance as a function of the drive variable than the main switching cells.

5. Device according to claim 4, wherein all the switching cells are driven by a drive circuit which effects at least one of the following conversions of a drive variable applied to the drive circuit:
level shift of a drive voltage; level shift of a drive current; conversion of a drive voltage into a current as a control variable; conversion of a drive current into a voltage as a control variable.

6. Device according to claim 1, wherein all the switching cells are at least one of having essentially the same construction and having an essentially uniform slope of the function of their output conductance as a function of their control variable, and wherein gate electrodes of the auxiliary switching cells are interconnected to each other and gate electrodes of the main switching cells are interconnected to each other, and further comprising means for driving the gate electrodes of the auxiliary switching cells and the gate electrodes of the main switching cells into a conducting mode with control variables differing from one another, at least in terms of amount, in a load range close to the overload limit.

7. Device according to claim 6, further comprising a second element across which a difference in the control variable is formed, the gate electrodes of the auxiliary switching cells and the main switching cells being operationally connected to one another via said second element.

8. Device according to claim 7, wherein the element is at least one of a resistor, a p-n semiconductor junction, and an n-p semiconductor junction.

9. Device according to claim 1, further comprising a drive circuit coupled to the main switching cells and the auxiliary switching cells, which comprises at least one charge pump for driving the switching cells.

10. Device according to claim 1, wherein a variable controlling current flow through the load current path is influenceable in that said variable can be short-circuited or diverted or discharged by the second semiconductor switch which is connected essentially in parallel with at least the control inputs of the main switching cells, and further comprising means for providing a control signal to the first semiconductor switch for limiting the load current to a value permissible over a relatively long time, said control signal being dependent on the chip temperature in the region of the auxiliary switching cells and on at least one separately and continuously measured part of the load current.

11. Device according to claim 1, further comprising means for effecting an influencing of the variable controlling the current flow through the load current path as a function of the chip temperature in the region of the auxiliary switching cells with a triggering characteristic in accordance with a fixed temperature hysteresis.

* * * * *